US008501618B2

(12) United States Patent
Lin et al.

(10) Patent No.: US 8,501,618 B2
(45) Date of Patent: Aug. 6, 2013

(54) SEMICONDUCTOR DEVICE AND METHOD OF FORMING RDL WIDER THAN CONTACT PAD ALONG FIRST AXIS AND NARROWER THAN CONTACT PAD ALONG SECOND AXIS

(75) Inventors: Yaojian Lin, Singapore (SG); Xia Feng, Singapore (SG); Jianmin Fang, Singapore (SG); Kang Chen, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/181,290

(22) Filed: Jul. 12, 2011

(65) Prior Publication Data

US 2012/0018904 A1 Jan. 26, 2012

Related U.S. Application Data

(60) Provisional application No. 61/367,807, filed on Jul. 26, 2010.

(51) Int. Cl.
*H01L 21/31* (2006.01)
(52) U.S. Cl.
USPC ........... 438/637; 257/774; 257/773; 257/784; 257/E21.159; 438/629; 438/638; 438/672; 438/673

(58) Field of Classification Search
USPC ................ 257/700, 758, 678, 691–692, 784, 257/773–774, E21.159, E29.111; 438/618–624, 438/637–638, 672–673, 700
See application file for complete search history.

(56) References Cited

U.S. PATENT DOCUMENTS

| 7,397,121 B2 | 7/2008 | Chou et al. | |
| 2002/0000668 A1* | 1/2002 | Sakihama et al. | 257/758 |
| 2003/0218246 A1* | 11/2003 | Abe et al. | 257/734 |

* cited by examiner

*Primary Examiner* — Dung A. Le
(74) *Attorney, Agent, or Firm* — Robert D. Atkins; Patent Law Group: Atkins & Associates, P.C.

(57) ABSTRACT

A semiconductor device has a semiconductor die and first conductive layer formed over a surface of the semiconductor die. A first insulating layer is formed over the surface of the semiconductor die. A second insulating layer is formed over the first insulating layer and first conductive layer. An opening is formed in the second insulating layer over the first conductive layer. A second conductive layer is formed in the opening over the first conductive layer and second insulating layer. The second conductive layer has a width that is less than a width of the first conductive layer along a first axis. The second conductive layer has a width that is greater than a width of the first conductive layer along a second axis perpendicular to the first axis. A third insulating layer is formed over the second conductive layer and first insulating layer.

25 Claims, 16 Drawing Sheets

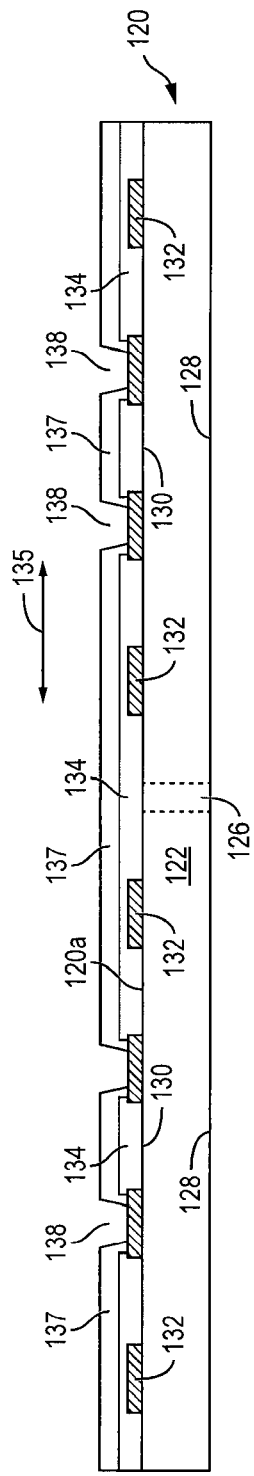
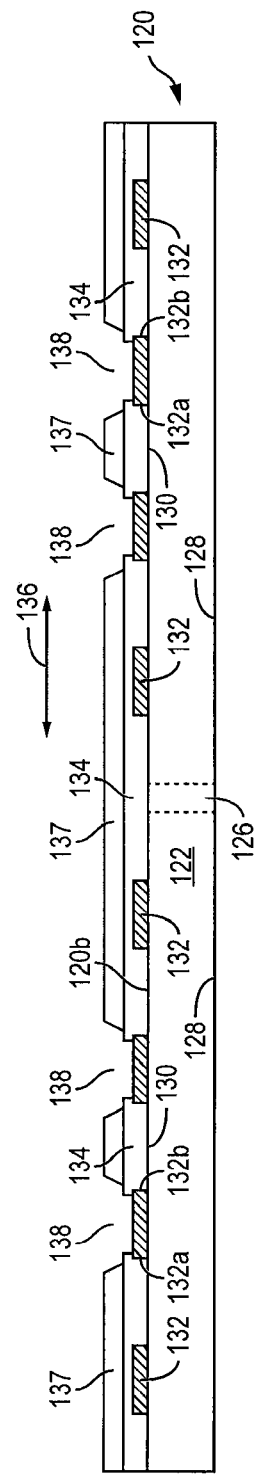
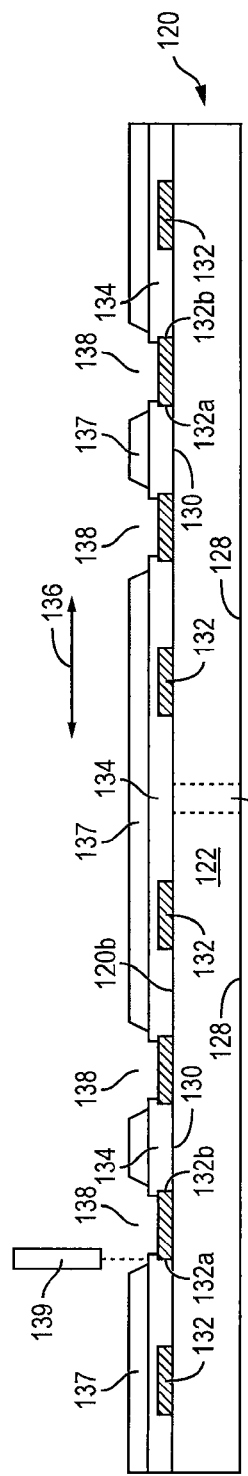
FIG. 4f
FIG. 4g
FIG. 4h

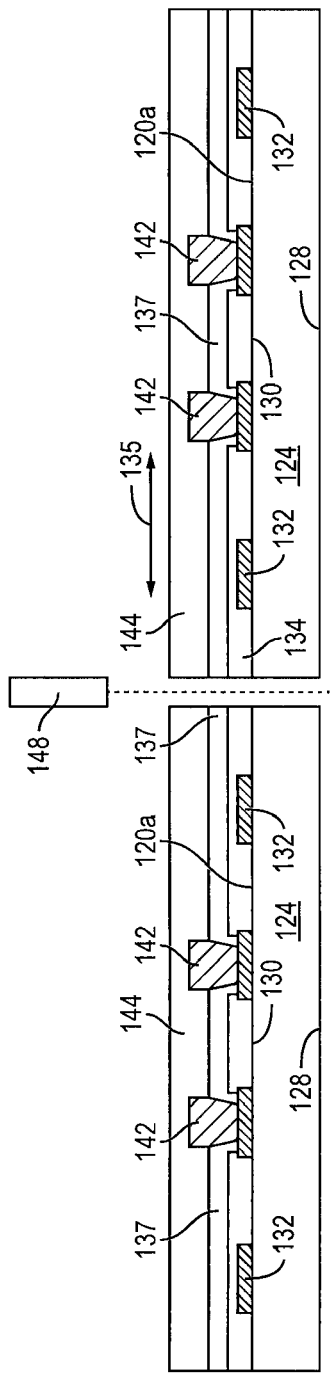
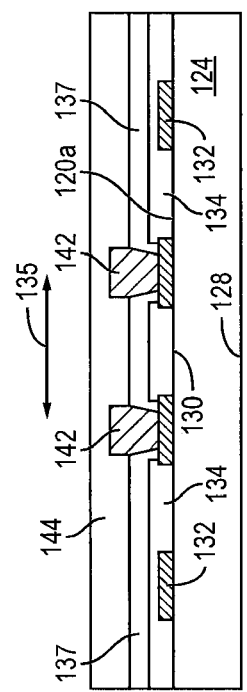
FIG. 4o
FIG. 5a

US 8,501,618 B2

SEMICONDUCTOR DEVICE AND METHOD OF FORMING RDL WIDER THAN CONTACT PAD ALONG FIRST AXIS AND NARROWER THAN CONTACT PAD ALONG SECOND AXIS

CLAIM TO DOMESTIC PRIORITY

The present application claims priority to Provisional Application No. 61/367,807, filed Jul. 26, 2010, and claims priority to the above application pursuant to 35 U.S.C. §120.

FIELD OF THE INVENTION

The present invention relates in general to semiconductor devices and, more particularly, to a semiconductor device and method of forming an RDL over a contact pad that is wider than the contact pad along a first axis and narrower than the contact pad along a second axis perpendicular to the first axis.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current, or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

FIG. 1a illustrates a conventional semiconductor device 10 with semiconductor die or wafer 12 in a fan-in or fan-out wafer level chip scale package (WLCSP). Semiconductor die 12 has an active surface 14 and contact pads 16 formed on the active surface. An insulating or passivation layer 18 is formed at the wafer level over active surface 14 and contact pads 16. A portion of insulating layer 18 is removed by an etching process to expose contact pads 16. An insulating or passivation layer 20 is formed at the wafer level over insulating layer 18 and the exposed contact pads 16. A portion of insulating layer 20 is removed by an etching process to expose contact pads 16. The opening in insulating layer 18 is typically 20 micrometers (μm) in order to have good electrical characteristics to contact pads 16. An electrically conductive layer 22 is formed over the exposed contact pads 16 and insulating layer 20. Conductive layer 22 operates as a redistribution layer (RDL) electrically connected to contact pads 16. Conductive layer 22 extends beyond the opening in insulating layer 20 to laterally redistribute the electrical interconnect to contact pad 16. An insulating or passivation layer 24 is formed over insulating layer 20 and conductive layer 22. A portion of insulating layer 24 is removed by an etching process to expose conductive layer 22 for electrical interconnect.

FIG. 1b shows a plan view of semiconductor device 10, taken along line 1b-1b of FIG. 1a with focus on contact pad area 26. The width of opening 28 in insulating layer 20 to expose contact pad 16 for deposition of conductive layer 22, and the width $W_{16-22}$ of the contact surface area between conductive layer 22 and contact pad 16, is 20 μm. The width between adjacent conductive layers 22 is 10 μm. An opening width $W_{16-22}$ of 20 μm is necessary for good electrical characteristics between conductive layer 22 and contact pads 16. However, due to the overlap of insulating layer 20 over contact pad 16 completely around the contact pad, a certain width and pitch of contact pad 16 is required to maintain the interconnect surface area between conductive layer 22 and contact pad 16. In one embodiment, a width of contact pad 16 is 45 μm, and the contact pad pitch is 50 μm. For a 10 μm overlap of insulating layer 20 over conductive layer 16 around opening 28, the width $W_{20-20}$ is 20+10+10=40 μm. The contact pad pitch of 50 μm becomes a process limitation due to the width $W_{20-20}$ (width of opening 28 plus overlap width) needed for good contact characteristics. If the width $W_{16-22}$ of opening 28 is reduced further, then the contact characteristics between conductive layer 22 and contact pad 16 is diminished.

SUMMARY OF THE INVENTION

A need exists to form an RDL over a contact pad with high alignment tolerance. Accordingly, in one embodiment, the present invention is a method of making a semiconductor device comprising the steps of providing a semiconductor die, forming a first conductive layer over a surface of the semiconductor die, forming a first insulating layer over the surface of the semiconductor die, forming a second insulating layer over the first insulating layer and first conductive layer, and forming an opening in the second insulating layer over the first conductive layer. The opening extends beyond the first conductive layer over first and second opposing edges of the first conductive layer while the second insulating layer overlies the first conductive layer with respect to third and fourth opposing edges of the first conductive layer perpendicular to the first and second opposing edges of the first conductive layer. The method further includes the steps of forming a second conductive layer over the first and second insulating layers and over a portion of the first conductive layer within the opening in the second insulating layer, and forming a third insulating layer over the second conductive layer and first and second insulating layers.

In another embodiment, the present invention is a method of making a semiconductor device comprising the steps of providing a semiconductor die, forming a first conductive layer over a surface of the semiconductor die, forming a first insulating layer over the first conductive layer and surface of the semiconductor die, forming a second conductive layer having a width that is less than a width of the first conductive layer along a first axis, and forming a second insulating layer over the second conductive layer and first insulating layer. The second conductive layer has a width that is greater than a width of the first conductive layer along a second axis perpendicular to the first axis.

In another embodiment, the present invention is a method of making a semiconductor device comprising the steps of providing a semiconductor die, forming a first conductive layer over a surface of the semiconductor die, forming a first insulating layer over the surface of the semiconductor die, and forming a second conductive layer over the first conductive layer that is wider than the first conductive layer along a first axis and narrower than the first conductive layer along a second axis perpendicular to the first axis.

In another embodiment, the present invention is a semiconductor device comprising a semiconductor die and first conductive layer formed over a surface of the semiconductor die. A first insulating layer is formed over the surface of the semiconductor die. A second conductive layer is formed over the first conductive layer that is wider than the first conductive layer along a first axis and narrower than the first conductive layer in a second axis perpendicular to the first axis. A second insulating layer is formed over the second conductive layer and first insulating layer.

BRIEF DESCRIPTION OF THE DRAWINGS

FIGS. 5a-5c illustrate the semiconductor die with the RDL formed over the contact pad.

DETAILED DESCRIPTION OF THE DRAWINGS

Figure 1A:
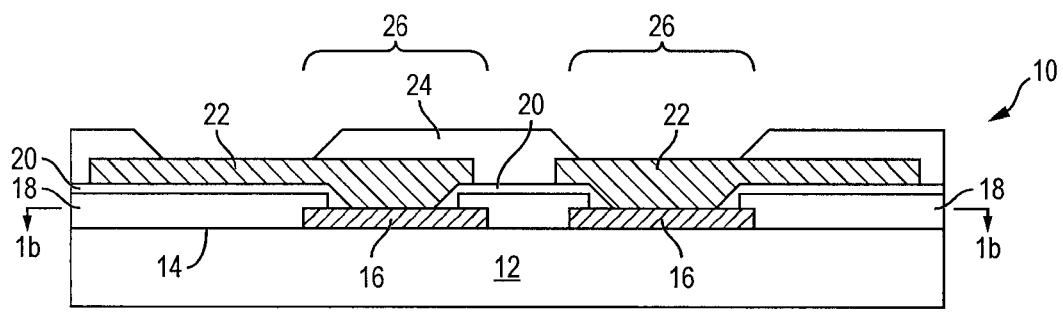
FIGS. 1a-1b shows a conventional semiconductor die mounted to a substrate with an electrical bridge defect.
Figure 1B:
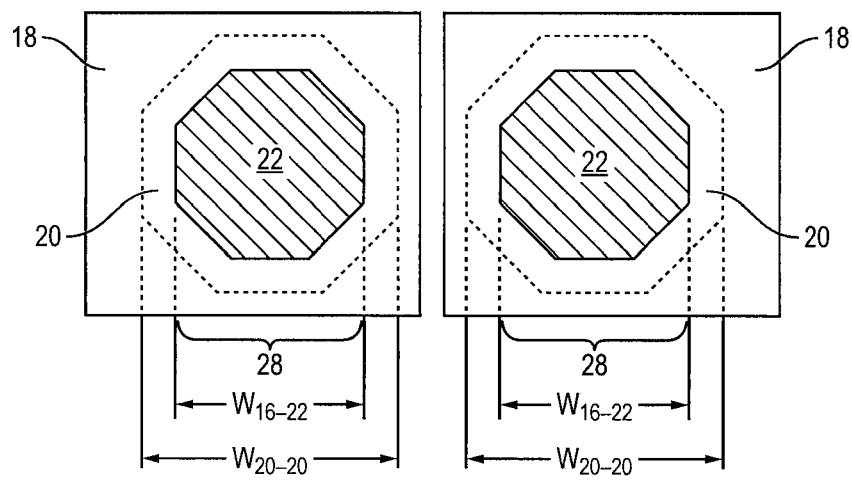

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
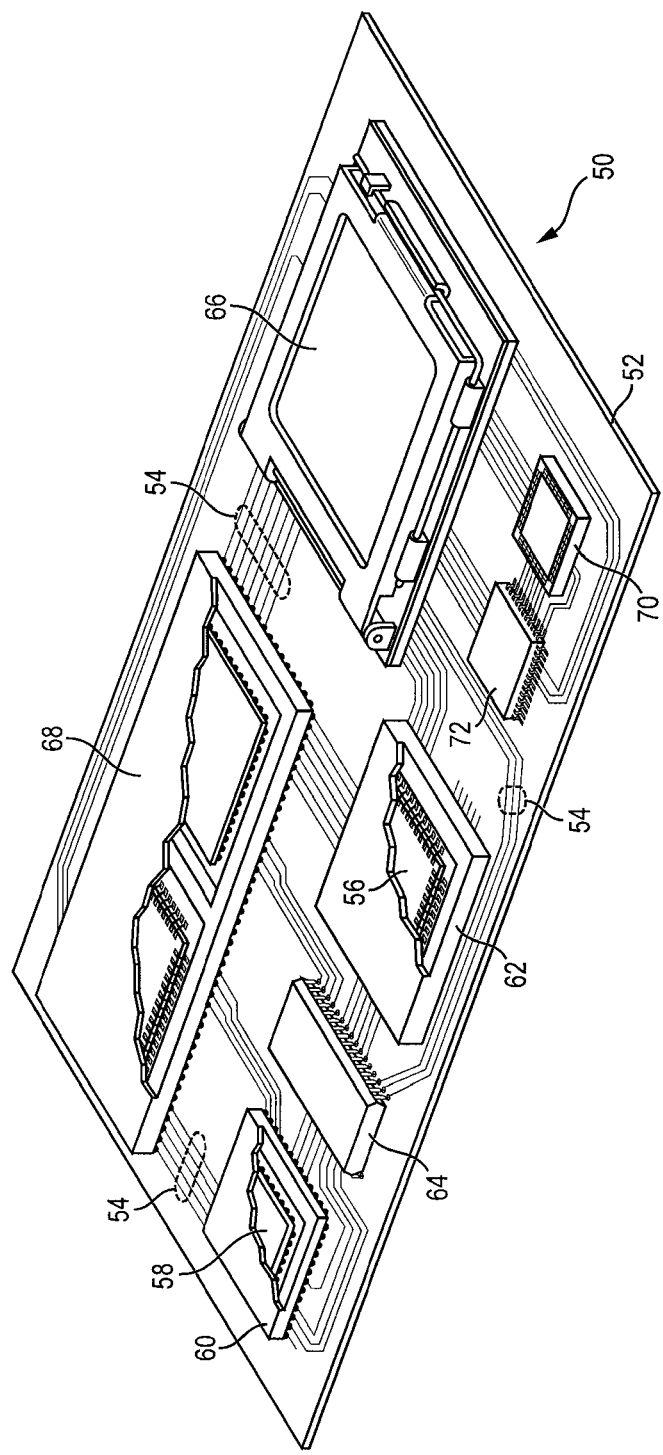
FIG. 2 illustrates a printed circuit board (PCB) with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
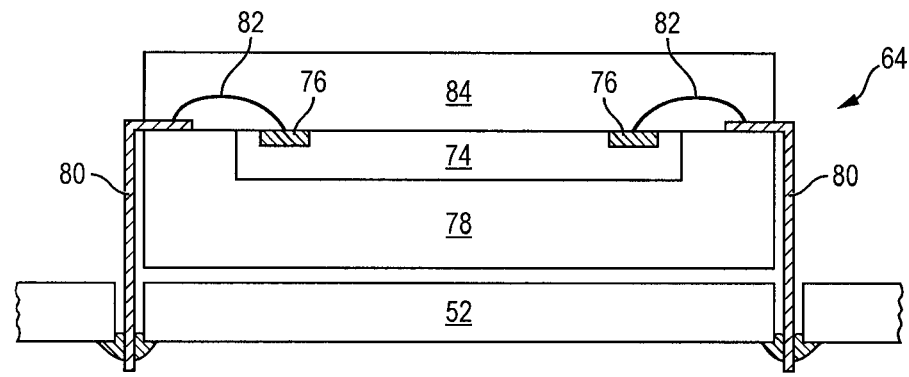
FIGS. 3a-3c illustrate further detail of the representative semiconductor packages mounted to the PCB.
Figure 3B:
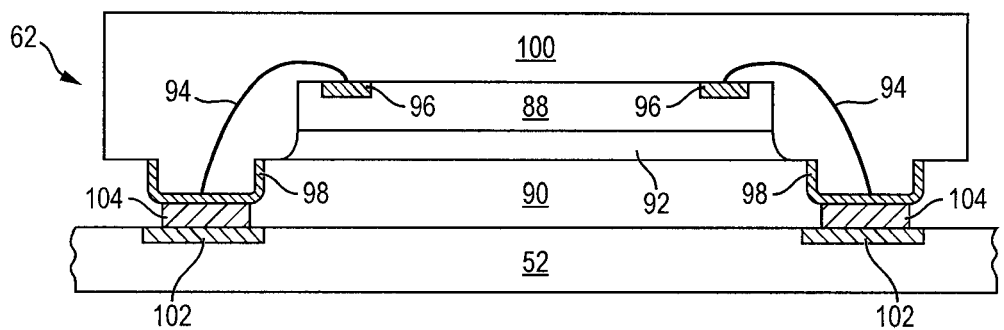
Figure 3C:
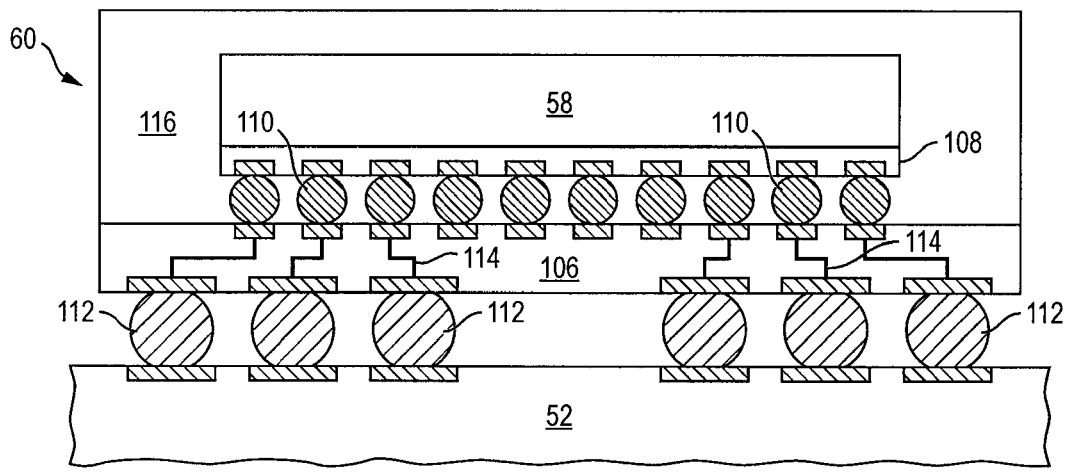

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
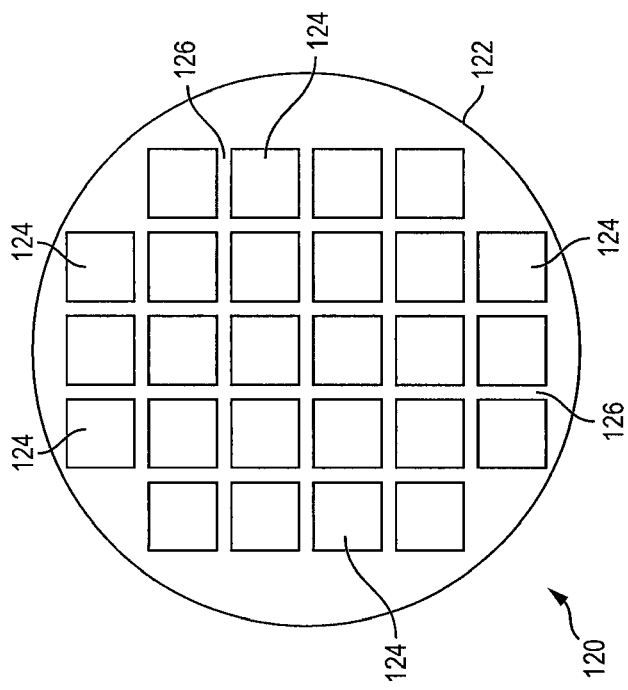
FIGS. 4a-4o illustrate a process of forming an RDL over a contact pad with a high alignment tolerance.

FIGS. 4a-4o illustrate, in relation to FIGS. 2 and 3a-3c, a process of forming an RDL over a contact pad with a high alignment tolerance. FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 4B:
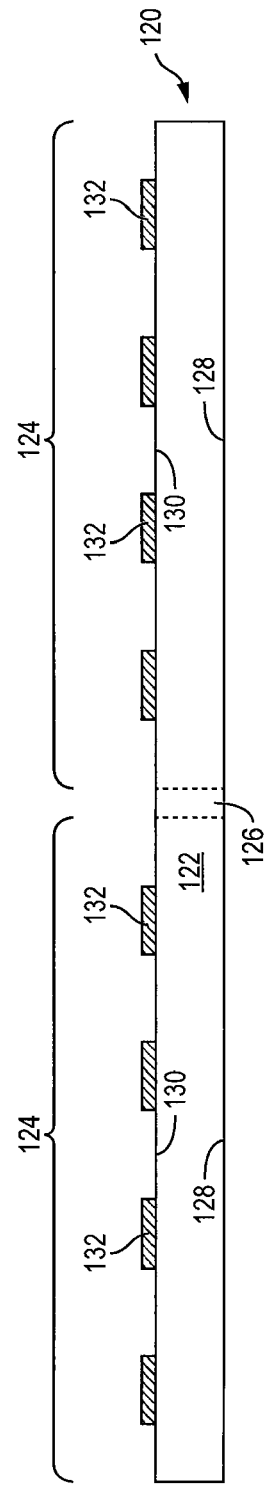

FIG. 4b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124. Alternatively, contact pads 132 can be offset in multiple rows such that a first row of contact pads is disposed a first distance from the edge of the die, and a second row of contact pads alternating with the first row is disposed a second distance from the edge of the die. Conductive layer 132 can be rectangular, circular, oval, or polygonal.

Figure 4C:
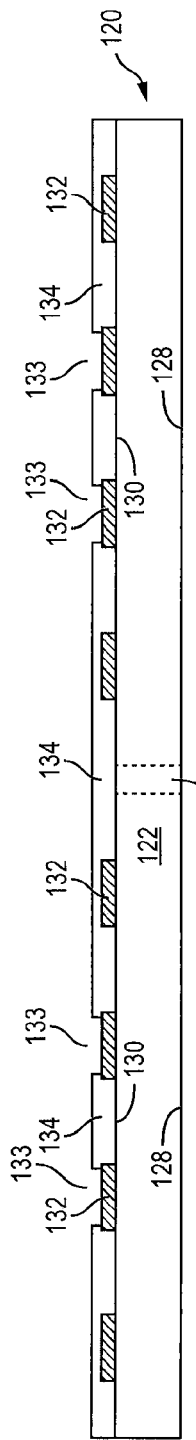

In FIG. 4c, an insulating or passivation layer 134 is formed over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), benzocyclobutene (BCB), polyimide (PI), polybenzoxazoles (PBO), suitable dielectric material, or other material having similar insulating and structural properties. A portion of insulating layer 134 is removed by an etching process through a photoresist layer (not shown) to forming openings 133 and expose conductive layer 132. In one embodiment, openings 133 in insulating layer 134 are octagonal, as shown in FIG. 4d.

Figure 4D:
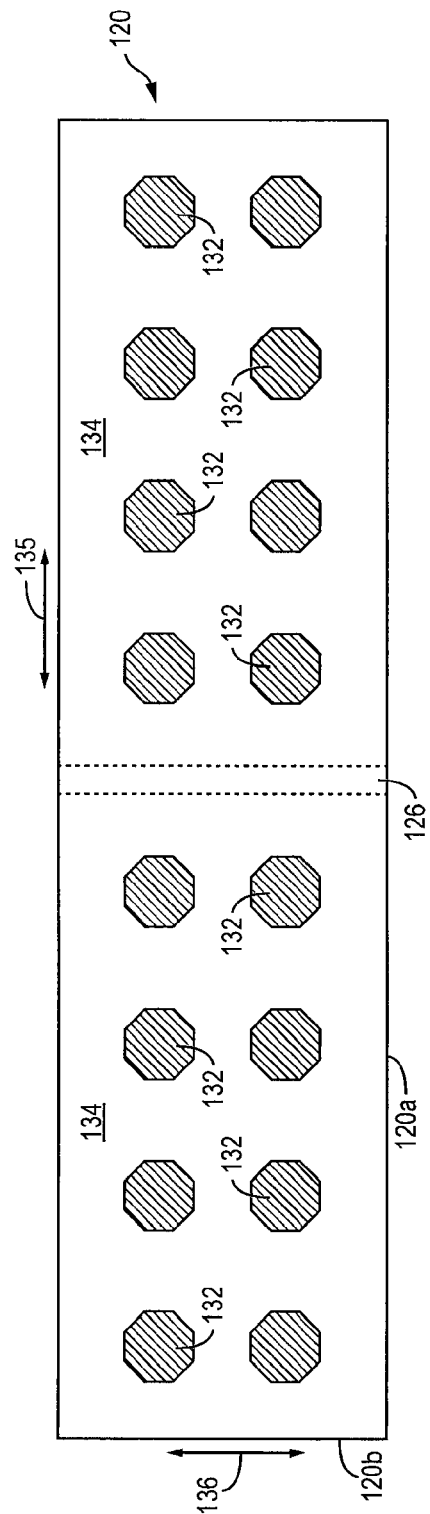

FIG. 4d shows a plan view of conductive layer 132 and insulating layer 134 along directional axis 135 and directional axis 136 perpendicular to axis 135. FIGS. 4e-4o are described in terms of views taken along surface 120a of substrate 120 in the direction of axis 135 and views taken along surface 120b in the direction of axis 136.

Figure 4E:
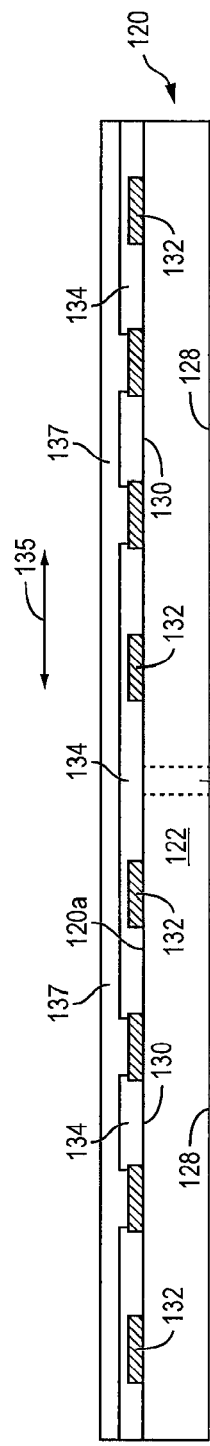

In FIG. 4e, an insulating or passivation layer 137 is formed over insulating layer 134 and the exposed conductive layer 132 using PVD, CVD, printing, spin coating, spray coating, sintering or thermal oxidation. The insulating layer 137 contains one or more layers of SiO2, Si3N4, SiON, Ta2O5, Al2O3, BCB, PI, PBO, suitable dielectric material, or other material having similar insulating and structural properties. A portion of insulating layer 137 is removed by an etching process through a photoresist layer to form openings 138 and expose a portion of conductive layer 132 with respect to insulting layer 137, as shown in FIG. 4f along surface 120a in the direction of axis 135. FIG. 4g shows openings 138 along surface 120b in the direction of axis 136.

In one embodiment, a portion of insulating layer 137 is removed by subjecting irradiated DFR material to a developer which selectively dissolves non-irradiated portions of the DFR material to create patterned openings 138 in insulating layer 137 disposed over conductive layer 132, while leaving the irradiated portions of the photoresist material intact.

Alternatively, patterned openings 138 can be formed by laser direct ablation (LDA) using laser 139 to remove portions of insulating layer 137 in applications requiring finer interconnect dimensions, as shown in FIG. 4h along surface 120b in the direction of axis 136.

Figure 4I:
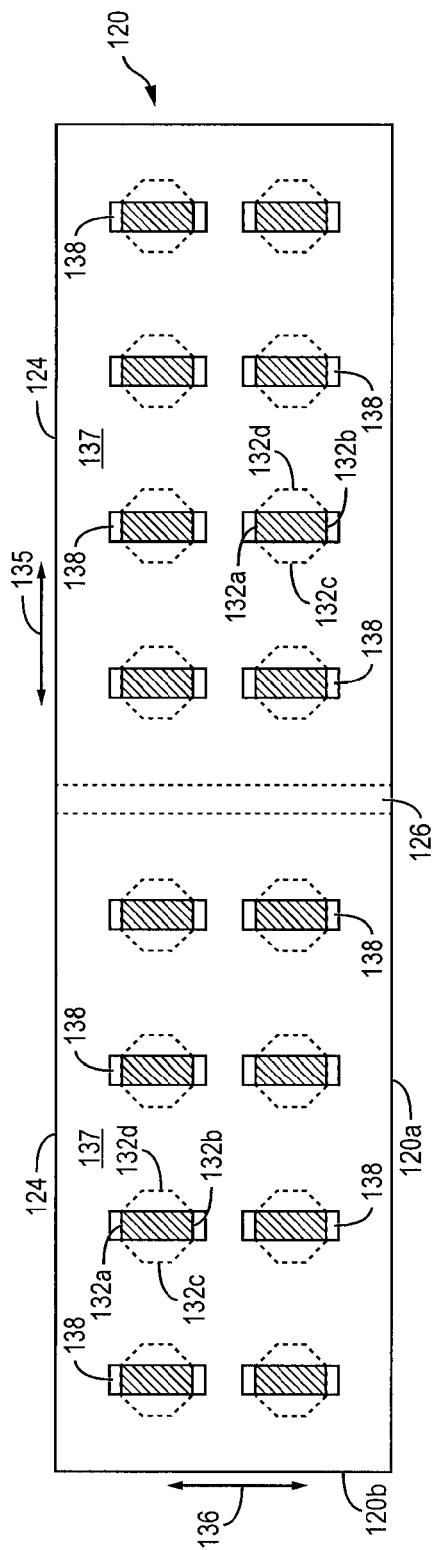

FIG. 4i shows a plan view of insulating layer 134, with patterned openings 138 formed through insulating layer 137 to expose portions of conductive layer 132. In particular, patterned openings 138 in insulating layer 137 extend beyond opposing edges 132a and 132b of conductive layer 132 in the direction of axis 136, while insulating layer 137 overlies opposing edges 132c and 132d of conductive layer 132 in the direction of axis 135, perpendicular to the direction of axis 136. A width of patterned openings 138 is less than a width of conductive layer 132 in the direction of axis 135, and a width of the patterned openings is greater than a width of conductive layer 132 in the direction of axis 136.

Figure 4J:
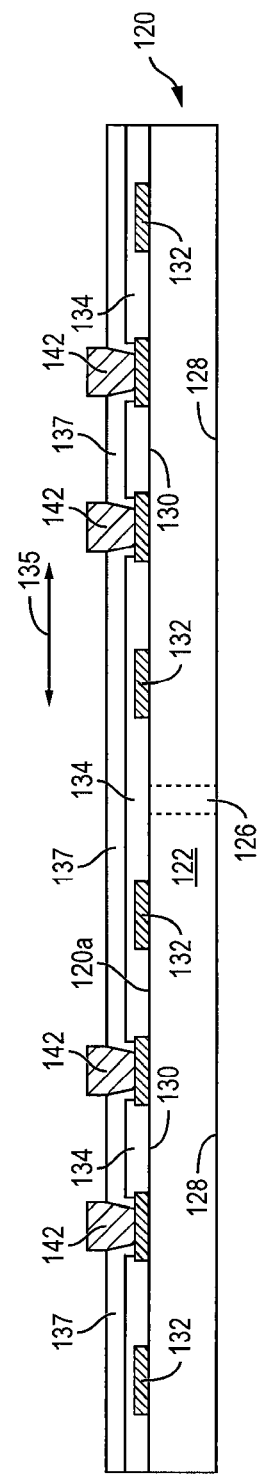
Figure 4K:
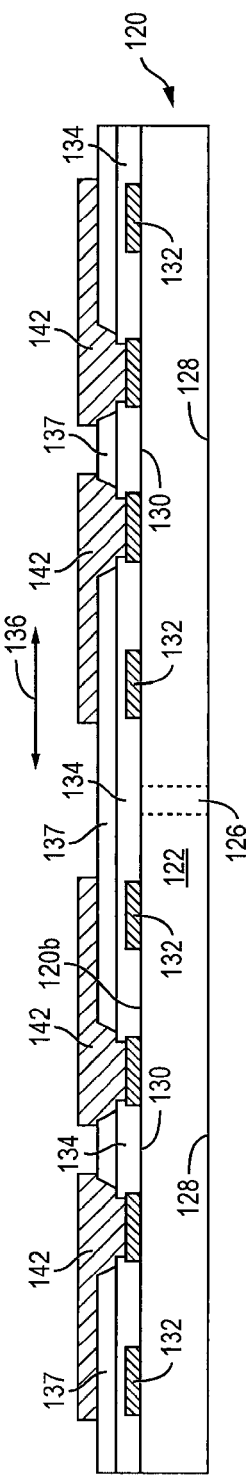

In FIG. 4j, an electrically conductive layer 142 is formed within patterned openings 138 over the exposed conductive layer 132 along surface 120a in the direction of axis 135 using a patterning and metal deposition process such as printing, PVD, CVD, sputtering, electrolytic plating, and electroless plating. FIG. 4k shows conductive layer 142 formed within patterned openings 138 over the exposed conductive layer 132 and insulating layers 134 and 137 along surface 120b in the direction of axis 136. Conductive layer 142 can be conformally applied to follow the contour of insulation layers 134 and 137 and conductive layer 132. Conductive layer 142 operates as an RDL electrically connected to conductive layer 132. Conductive layer 142 extends in a direction parallel to active surface 130, beyond patterned openings 138 in insulating layer 137 in the direction of axis 136, to laterally redistribute the electrical interconnect to conductive layer 132.

Figure 4L:
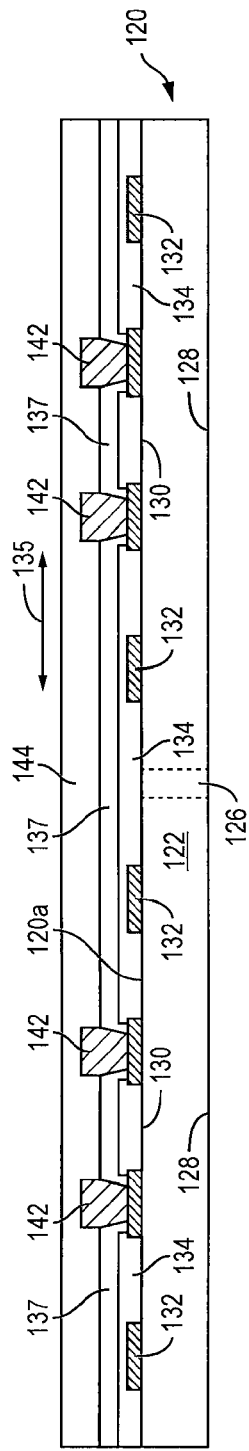
Figure 4M:
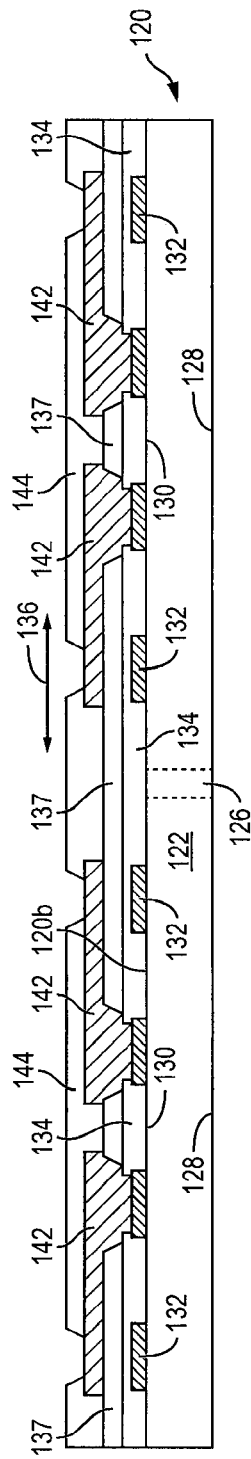

In FIG. 4l, an insulating or passivation layer 144 is formed over insulating layer 137 and conductive layer 142 along surface 120a in the direction of axis 135 using PVD, CVD, printing, spin coating, spray coating, sintering or thermal oxidation. FIG. 4m shows insulating layer 144 formed over insulating layer 137 and conductive layer 142 along surface 120b in the direction of axis 136. The insulating layer 144 contains one or more layers of SiO2, Si3N4, SiON, Ta2O5, Al2O3, BCB, PI, PBO, suitable dielectric material, or other material having similar insulating and structural properties. A portion of insulating layer 144 is removed by an etching process through a photoresist layer to expose a portion conductive layer 142 along surface 120b in the direction of axis 136 outside a footprint of conductive layer 132 for electrical interconnect.

Figure 4N:
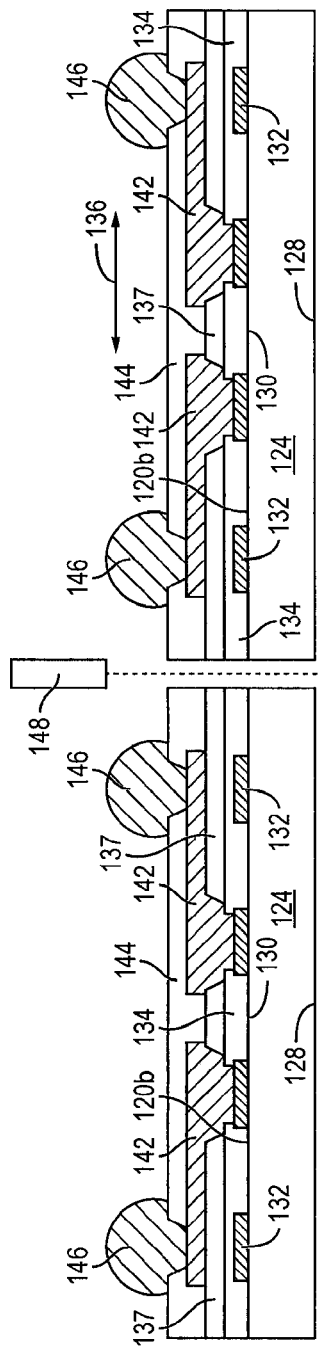

In FIG. 4n, an electrically conductive bump material is deposited over the exposed conductive layer 142 along surface 120b in the direction of axis 136 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 142 using a suitable attachment or bonding process. In one embodiment, the bump material is reflowed by heating the material above its melting point to form bumps 146. In some applications, bumps 146 are reflowed a second time to improve electrical contact to conductive layer 142. Bumps 146 can also be compression bonded to conductive layer 142. An under bump metallization (UBM) layer can be formed between bumps 146 and conductive layer 142. Bumps 146 represent one type of interconnect structure that can be formed over conductive layer 142. The interconnect structure can also use stud bump, micro bump, or other electrical interconnect.

Figure 5B:
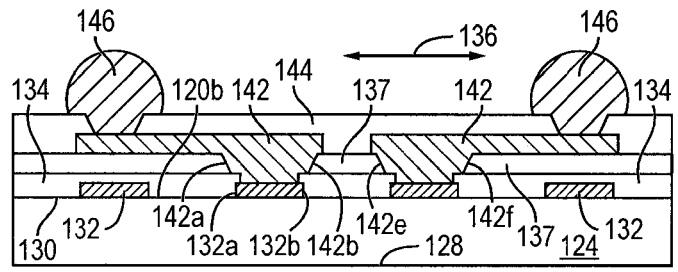

FIGS. 4n and 4o illustrate semiconductor wafer 120 singulated through saw street 126 using a saw blade or laser cutting tool 148 into individual semiconductor die 124. FIG. 5a shows semiconductor die 124 along surface 120a in the direction of axis 135 after singulation. FIG. 5b shows semiconductor die 124 along surface 120b in the direction of axis 136 after singulation. Semiconductor die 124 is electrically connected through conductive layers 132 and 142 to bumps 146. The patterned openings 138 expose a portion of conductive layer 132 with respect to insulting layer 137. Conductive layer 142 is formed over insulating layers 134 and 137 and the exposed conductive layer 132. Since insulating layer 137 overlaps conductive layer 132 in the direction of axis 135, the width of conductive layer 142 is less than the width of conductive layer 132 in the direction of axis 135. Conductive layer 142 extends beyond opposing edges 132a-132b of conductive layer 132 in the direction of axis 136. Since insulating layer 137 does not overlap conductive layer 132 in the direction of axis 136, conductive layer 142 extends completely over conductive layer 132 between edges 142a and 142b of conductive layer 142.

Figure 5C:
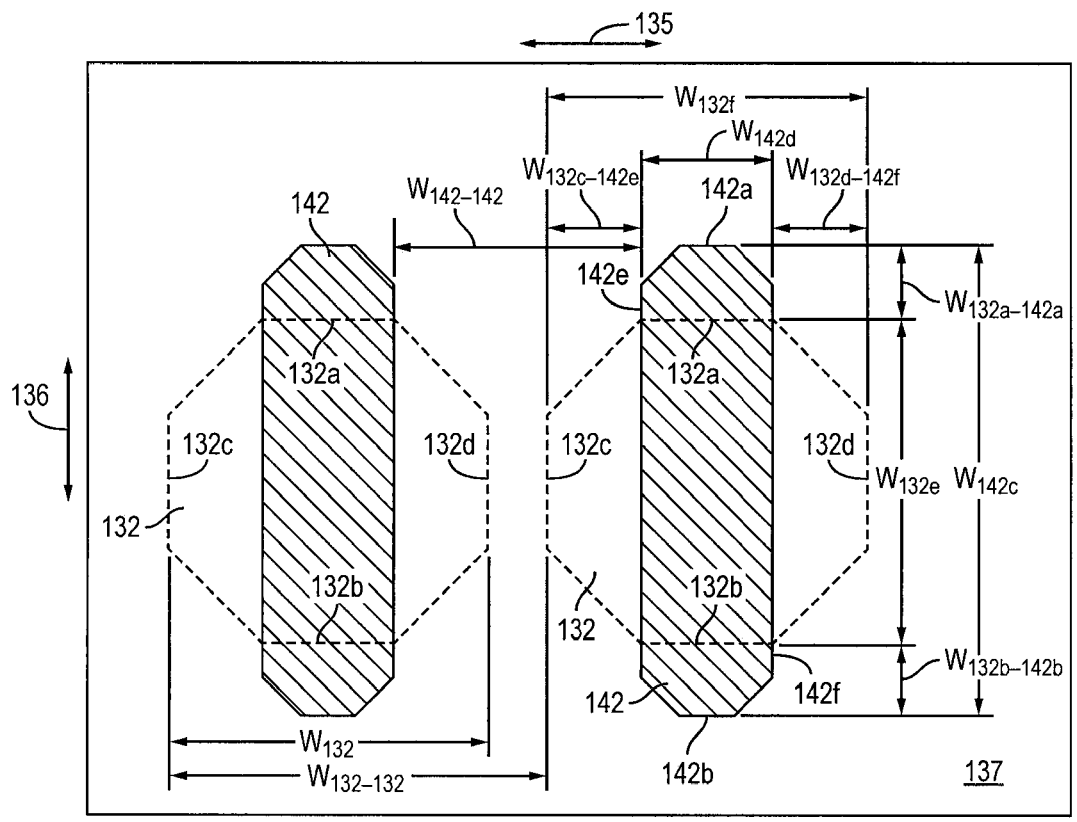

FIG. 5c shows an enlarged plan view of conductive layers 132 and 142 and insulating layer 134. In one embodiment, the width $W_{132}$ of conductive layer 132 is 40 μm and the pitch $W_{132\text{-}132}$ of conductive layer 132 is 45 μm. More generally, the pitch of conductive layer 132 can range from 30-50 micrometers. The patterned openings 138 in insulating layer 137 extend beyond opposing edges 132a and 132b of conductive layer 132 in the direction of axis 136, while insulating layer 137 overlies opposing edges 132c and 132d of conductive layer 132 in the direction of axis 135, perpendicular to the direction of axis 136. The width $W_{142c}$ of conductive layer 142 is greater than a width $W_{132e}$ of conductive layer 132 in the direction of axis 136. In one embodiment, the width $W_{142c}$ of conductive layer 142 is 70 μm and the width $W_{132e}$ of conductive layer 132 is 40 μm. Conductive layer 142 overlaps insulating layer 134 and extends beyond edge 132a of conductive layer 132 by $W_{132a\text{-}142a}$ and $W_{132b\text{-}142b}$, i.e., dual side overlap of conductive layer 132. That is, $W_{132a\text{-}142a}$ is the width of conductive layer 142 between edge 132a of conductive layer 132 and edge 142a of conductive layer 142, and $W_{132b\text{-}142b}$ is the width of conductive layer 142 between edge 132b of conductive layer 132 and edge 142b of conductive layer 142. In one embodiment, $W_{132a\text{-}142a}$ and $W_{132b\text{-}142b}$ are 10-20 μm, e.g., 15 μm.

In addition, the width $W_{142d}$ of conductive layer 142 is less than a width of conductive layer 132 in the direction of axis 135. In one embodiment, the width $W_{142d}$ of conductive layer 142 is 10 μm and the width $W_{132f}$ of conductive layer 132 is 40 μm. $W_{132c\text{-}142e}$ is the width of conductive layer 132 between edge 132c of conductive layer 132 and edge 142e of conductive layer 142, and $W_{132d\text{-}142f}$ is the width of conductive layer 132 between edge 132d of conductive layer 132 and edge 142f of conductive layer 142. In one embodiment, $W_{132e\text{-}142e}$ and $W_{132d\text{-}142f}$ are 10-20 μm, e.g., 15 μm. The width of contact interface $W_{132e}$ between conductive layer 132 and conductive layer 142 is at least 40 μm for good electrical characteristics, e.g., low contact resistance. The contact interface area is at least 40×10=400 μm². More generally, the width of the contact interface between conductive layer 132 and conductive layer 142 can range from 20-40 micrometers. The width between adjacent conductive layers 142 $W_{142\text{-}142}$ is at least 35 μm. By increasing the size of opening 138 to fully expose conductive layer 132 with respect to insulting layer 137 in the dual side overlap, a high alignment tolerance is achieved for conductive layer 142 without sacrificing the contact interface $W_{132c}$ by $W_{142d}$.

Figure 6A:
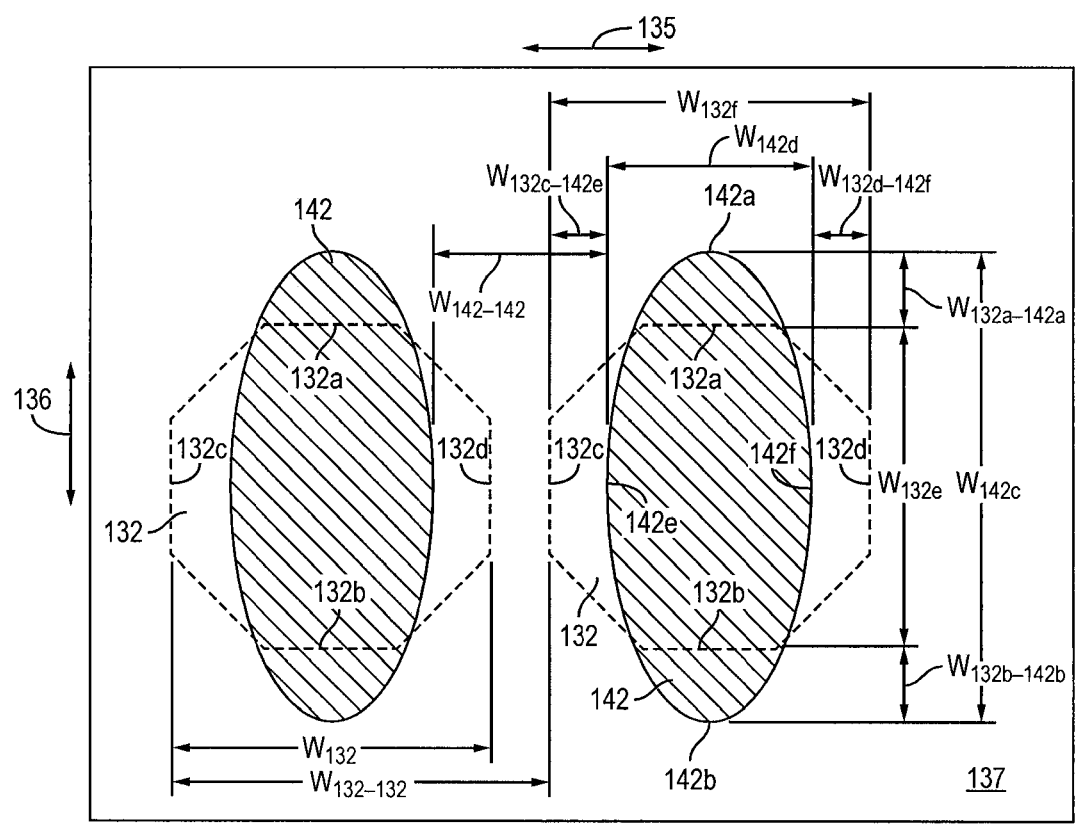
FIGS. 6a-6f illustrate alternate embodiment of the RDL formed over the contact pad.
Figure 6B:
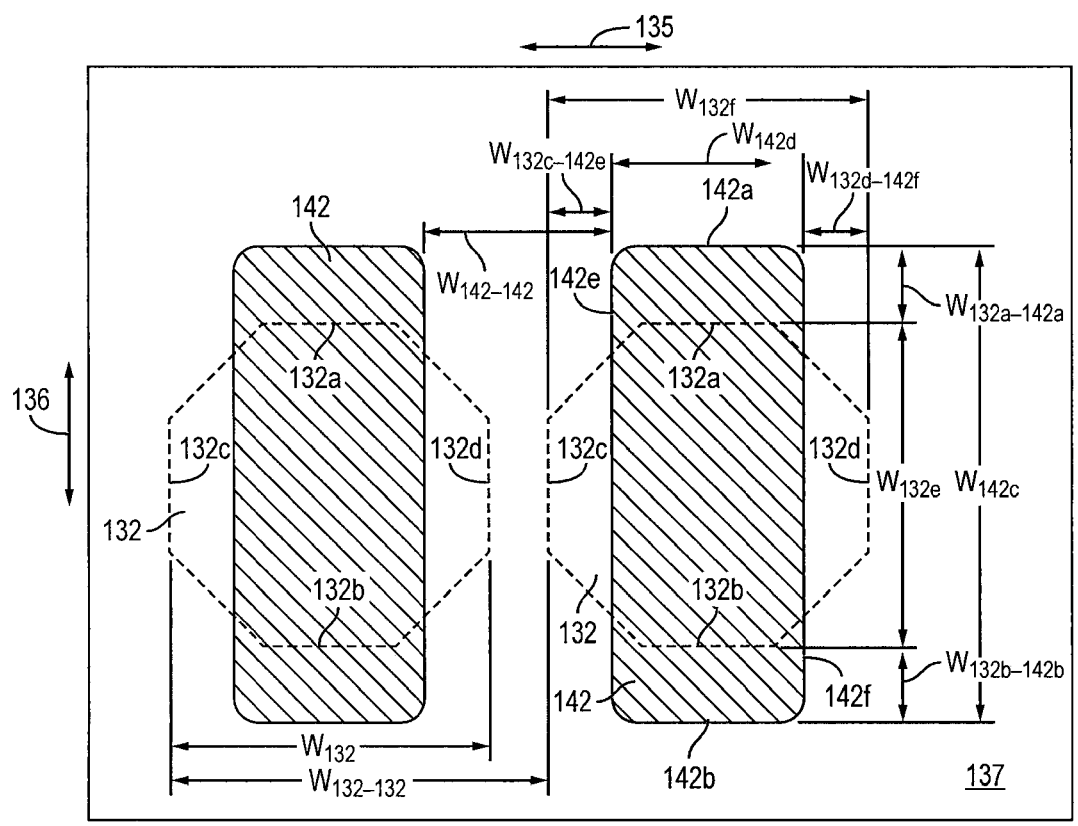
Figure 6C:
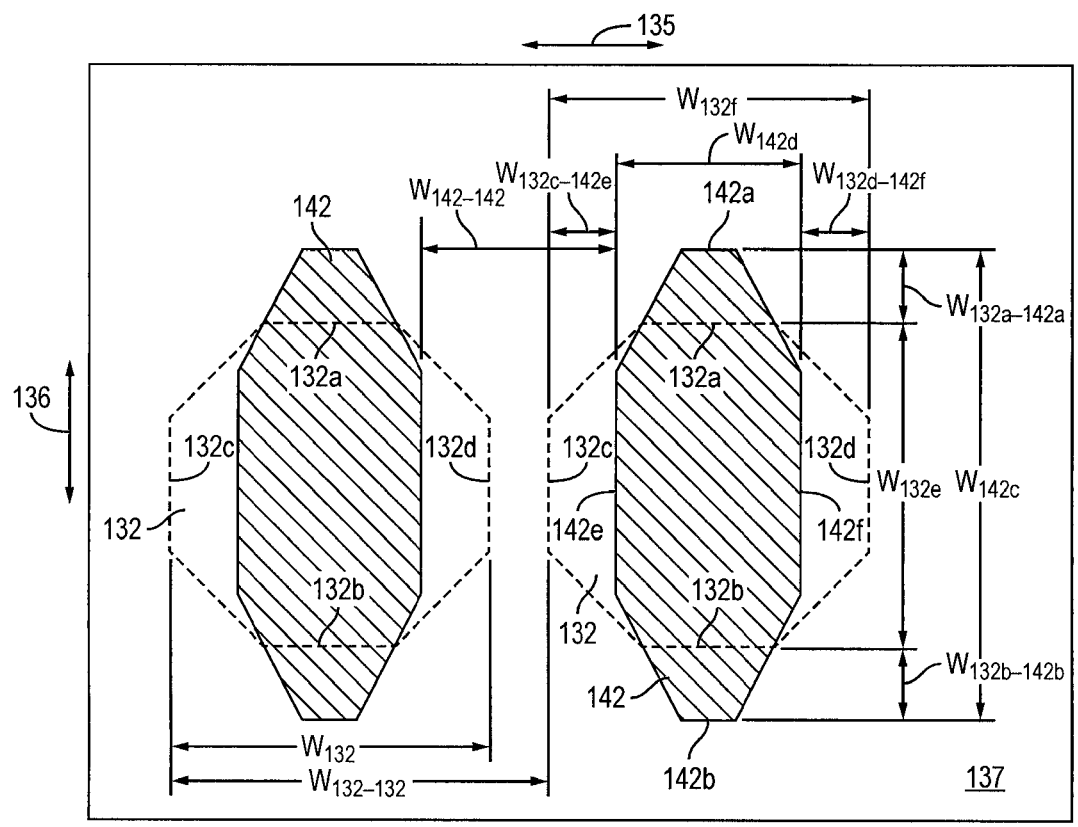
Figure 6D:
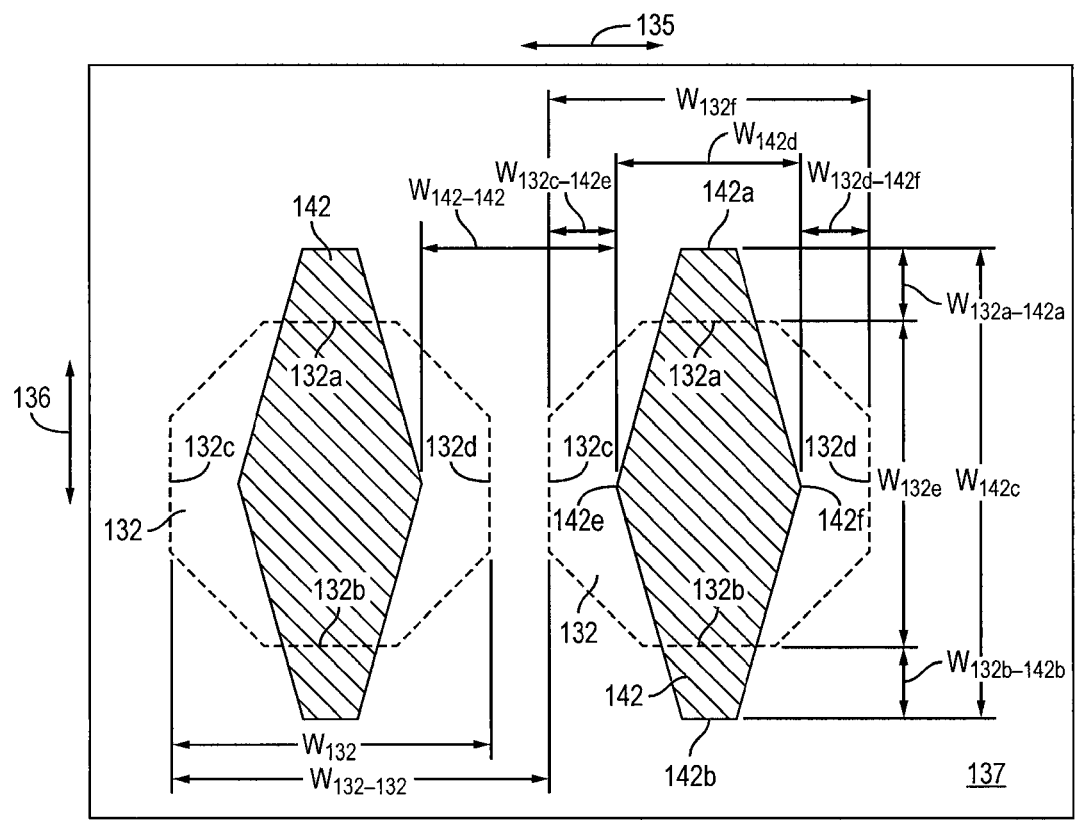
Figure 6E:
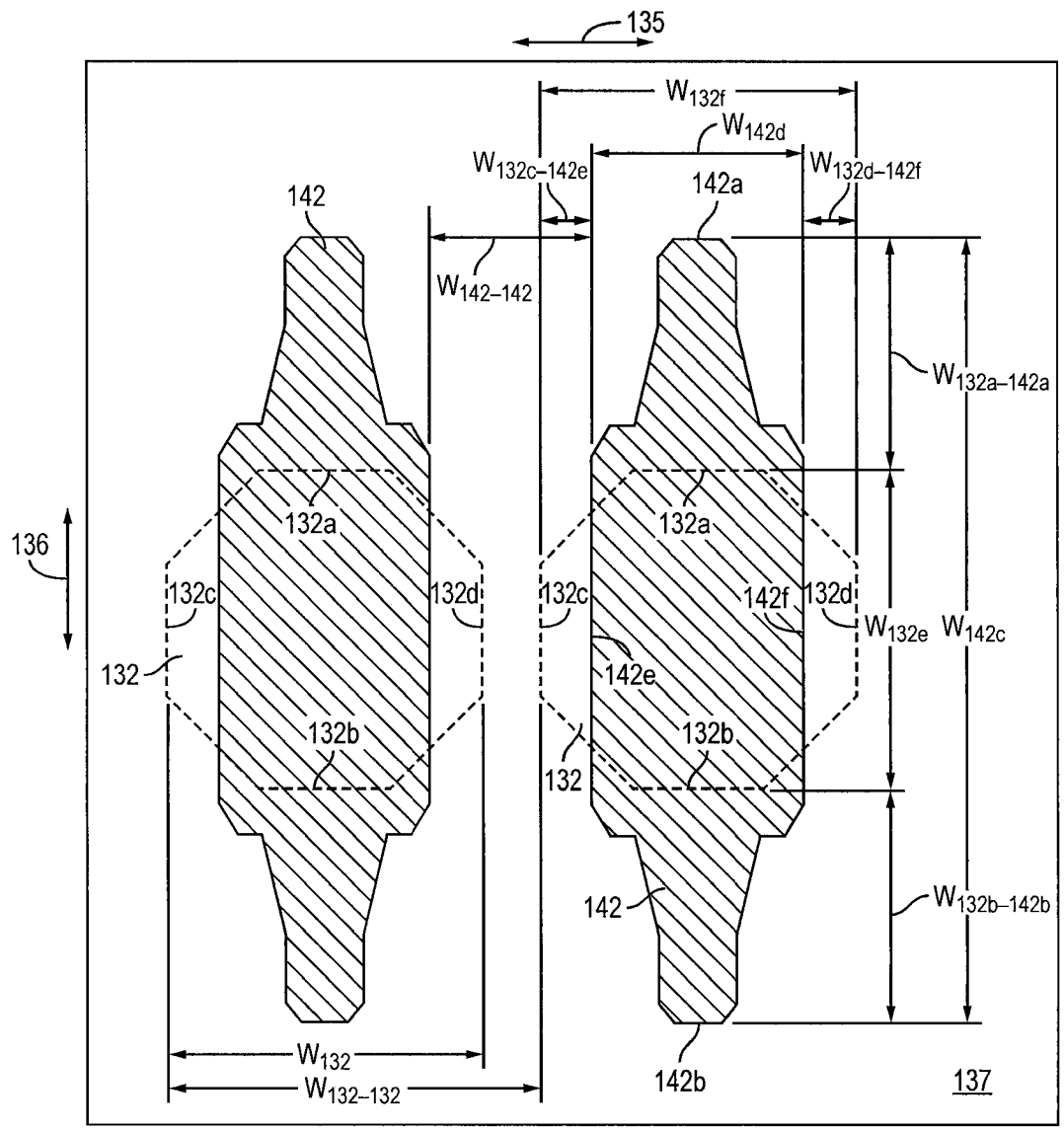
Figure 6F:
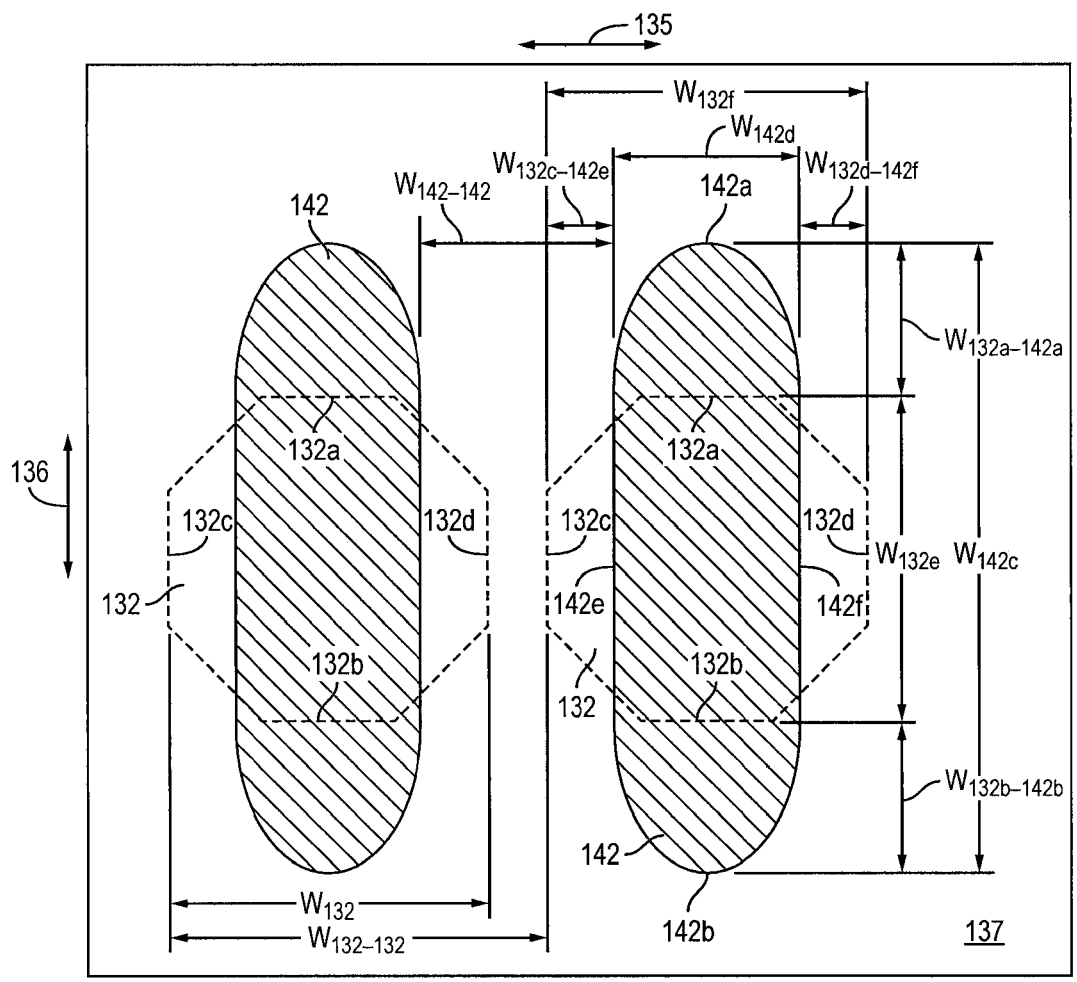

FIGS. 6a-6f shows alternate embodiments of insulating layer 137 and conductive layers 132 and 142. The shape of patterned openings 138 determine the shape of conductive layer 142, including rectangular, oval, rounded corners, and polygon. FIG. 6a shows an oval shape elongated in the direction of axis 136 for patterned openings 138 and conductive layer 142. FIG. 6b shows a generally rectangular shape with rounded corners for patterned openings 138 and conductive layer 142. FIG. 6c shows a generally polygon shape elongated in the direction of axis 136 for patterned openings 138 and conductive layer 142. FIG. 6d shows another generally polygon shape elongated in the direction of axis 136 for patterned openings 138 and conductive layer 142. FIG. 6e shows a generally rectangular shape with extensions in the direction of axis 136 for patterned openings 138 and conductive layer 142. FIG. 6f shows a generally rectangular shape with rounded ends for patterned openings 138 and conductive layer 142.

In each case, patterned openings 138 in insulating layer 137 extend beyond opposing edges 132a and 132b of conductive layer 132 in the direction of axis 136, while insulating layer 137 overlies opposing edges 132c and 132d of conductive layer 132 in the direction of axis 135, perpendicular to the direction of axis 136. The width $W_{142c}$ of conductive layer 142 is greater than a width $W_{132e}$ of conductive layer 132 in the direction of axis 136. In one embodiment, the width $W_{142c}$ of conductive layer 142 is 70 µm and the width $W_{132e}$ of conductive layer 132 is 40 µm. Conductive layer 142 overlaps insulating layer 134 and extends beyond edge 132a of conductive layer 132 by $W_{132a-142a}$ and $W_{132b-142b}$, i.e., dual side overlap of conductive layer 132. That is, $W_{132a-142a}$ is the width of conductive layer 142 between edge 132a of conductive layer 132 and edge 142a of conductive layer 142, and $W_{132b-142b}$ is the width of conductive layer 142 between edge 132b of conductive layer 132 and edge 142b of conductive layer 142. In one embodiment, $W_{132a-142a}$ and $W_{132b-142b}$ are 10-20 µm, e.g., 15 µm.

In addition, the width $W_{142d}$ of conductive layer 142 is less than a width of conductive layer 132 in the direction of axis 135. In one embodiment, the width $W_{142d}$ of conductive layer 142 is 10 µm and the width $W_{132f}$ of conductive layer 132 is 40 µm. $W_{132c-142e}$ is the width of conductive layer 132 between edge 132c of conductive layer 132 and edge 142e of conductive layer 142, and $W_{132d-142f}$ is the width of conductive layer 132 between edge 132d of conductive layer 132 and edge 142f of conductive layer 142. In one embodiment, $W_{132e-142e}$ and $W_{132d-142f}$ are 10-20 µm, e.g., 15 µm. The width of contact interface $W_{132e}$ between conductive layer 132 and conductive layer 142 is at least 40 µm for good electrical characteristics, e.g., low contact resistance. The contact interface area is at least 40×10=400 µm². More generally, the width of the contact interface between conductive layer 132 and conductive layer 142 can range from 20-40 micrometers. The width between adjacent conductive layers 142 $W_{142-142}$ is at least 35 µm. By increasing the size of opening 138 to fully expose conductive layer 132 with respect to insulting layer 137 in the dual side overlap, a high alignment tolerance is achieved for conductive layer 142 without sacrificing the contact interface $W_{132e}$ by $W_{142d}$.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a semiconductor die;
   forming a first conductive layer over a surface of the semiconductor die;
   forming a first insulating layer over the surface of the semiconductor die;
   forming a second insulating layer over the first insulating layer and first conductive layer;
   forming an opening in the second insulating layer over the first conductive layer, the opening extending beyond the first conductive layer over first and second opposing edges of the first conductive layer while the second insulating layer overlies the first conductive layer with respect to third and fourth opposing edges of the first conductive layer perpendicular to the first and second opposing edges of the first conductive layer;
   forming a second conductive layer over the first and second insulating layers and over a portion of the first conductive layer within the opening in the second insulating layer; and
   forming a third insulating layer over the second conductive layer and first and second insulating layers.

2. The method of claim 1, wherein the opening in the second insulating layer extends beyond the first and second opposing edges of the first conductive layer by 10-20 micrometers.

3. The method of claim 1, wherein the second insulating layer overlies the first conductive layer with respect to the third and fourth opposing edges of the first conductive layer by 10-20 micrometers.

4. The method of claim 1, wherein a width of the second conductive layer is greater than a width of the first conductive layer between the first and second opposing edges of the first conductive layer, and a width of the second conductive layer is less than a width of the first conductive layer between the third and fourth opposing edges of the first conductive layer.

5. The method of claim 1, wherein a width of a contact interface between the first conductive layer and second conductive layer ranges from 20-40 micrometers.

6. The method of claim 1, wherein a pitch of the first conductive layer ranges from 30-50 micrometers.

7. A method of making a semiconductor device, comprising:
   providing a semiconductor die;
   forming a first conductive layer over a surface of the semiconductor die;
   forming a first insulating layer including an opening over the first conductive layer;
   forming a second conductive layer within the opening over the first conductive layer, the second conductive layer including a width that is less than a width of the first conductive layer along a first axis and a width that is greater than a width of the first conductive layer along a second axis perpendicular to the first axis; and
   forming a second insulating layer over the second conductive layer and first insulating layer.

8. The method of claim 7, further including forming the opening in the first insulating layer extending beyond the first conductive layer over first and second opposing edges of the first conductive layer while the second insulating layer overlies the first conductive layer with respect to third and fourth opposing edges of the first conductive layer perpendicular to the first and second opposing edges of the first conductive layer.

9. The method of claim 7, further including forming a third insulating layer over the surface of the semiconductor die prior to forming the first insulating layer.

10. The method of claim 7, wherein the width of the second conductive layer is greater than the width of the first conductive layer along the second axis by 10-20 micrometers.

11. The method of claim 7, wherein the width of the first conductive layer is greater than the width of the second conductive layer along the first axis by 10-20 micrometers.

12. The method of claim 7, wherein a width of a contact interface between the first conductive layer and second conductive layer ranges from 20-40 micrometers.

13. The method of claim 7, wherein a pitch of the first conductive layer ranges from 30-50 micrometers.

14. A method of making a semiconductor device, comprising:
   providing a semiconductor die;
   forming a first conductive layer over a surface of the semiconductor die;
   forming a first insulating layer over the semiconductor die; and
   forming a second conductive layer over the first conductive layer that is wider than the first conductive layer along a first axis and narrower than the first conductive layer along a second axis perpendicular to the first axis.

15. The method of claim 14, further including:
forming a second insulating layer over the surface of the semiconductor die prior to forming the first insulating layer; and
forming a third insulating layer over the second conductive layer and first insulating layer.

16. The method of claim 14, further including forming an opening in the first insulating layer over the first conductive layer, the opening extending beyond the first conductive layer on first and second opposing edges of the first conductive layer while the first insulating layer overlies the first conductive layer with respect to third and fourth opposing edges of the first conductive layer perpendicular to the first and second opposing edges of the first conductive layer.

17. The method of claim 14, wherein a width of the second conductive layer is greater than a width of the first conductive layer along the first axis by 10-20 micrometers.

18. The method of claim 14, wherein a width of the second conductive layer is less than a width of the first conductive layer along the second axis by 10-20 micrometers.

19. The method of claim 14, wherein a width of a contact interface between the first conductive layer and second conductive layer ranges from 20-40 micrometers.

20. The method of claim 14, wherein a pitch of the first conductive layer ranges from 30-50 micrometers.

21. A semiconductor device, comprising:
a semiconductor die;
a first conductive layer formed over a surface of the semiconductor die;
a first insulating layer formed over the surface of the semiconductor die; and
a second conductive layer formed over the first conductive layer that is wider than the first conductive layer along a first axis and narrower than the first conductive layer along a second axis perpendicular to the first axis.

22. The semiconductor device of claim 21, wherein a width of the second conductive layer is greater than a width of the first conductive layer along the first axis by 10-20 micrometers.

23. The semiconductor device of claim 21, wherein a width of the second conductive layer is less than a width of the first conductive layer along the second axis by 10-20 micrometers.

24. The semiconductor device of claim 21, wherein a width of a contact interface between the first conductive layer and second conductive layer ranges from 20-40 micrometers.

25. The semiconductor device of claim 21, wherein a pitch of the first conductive layer ranges from 30-50 micrometers.

\* \* \* \* \*